United States Patent [19]

Breeden

[11] 4,144,300

[45] Mar. 13, 1979

[54] CHEMICAL ETCHING OF RECORD PATTERNS AND THE LIKE

[75] Inventor: Arnold H. Breeden, Indianapolis, Ind.

[73] Assignee: Joseph P. Rolles, Indianapolis, Ind.

[21] Appl. No.: 723,575

[22] Filed: Sep. 15, 1976

[51] Int. Cl.$^2$ .............................................. B29D 17/00
[52] U.S. Cl. ..................... 264/106; 96/38.2; 96/39; 156/630; 156/659; 264/22; 264/511; 264/132; 264/219
[58] Field of Search ................... 264/219, 22, 132, 90, 264/106, 107; 156/659, 630; 96/36, 39, 38.1, 38.2

[56] References Cited

U.S. PATENT DOCUMENTS

| | | | |
|---|---|---|---|
| 2,816,025 | 12/1957 | Dahlberg | 156/659 |
| 3,277,541 | 10/1966 | Wilton et al. | 156/659 |
| 3,303,254 | 2/1967 | Simons | 264/219 |
| 3,739,051 | 6/1973 | Smith | 264/219 |
| 3,787,274 | 1/1974 | Genma | 264/107 |
| 3,787,275 | 1/1974 | Genma | 264/107 |

*Primary Examiner*—Jeffery R. Thurlow
*Attorney, Agent, or Firm*—Woodard, Weikart, Emhardt & Naughton

[57] ABSTRACT

A method is disclosed herein for forming characters, figures, logos and the like on the surface of an article such as a record which is produced from a pattern. The pattern is formed initially according to customary techniques, and the characters are then chemically etched into the surface of the pattern so that the characters will appear in proper form upon the article produced from the pattern. The pattern may be formed from any metal or other material which may be chemically etched with sufficient resolution. The article formed from the pattern may be produced by a number of known processes such as molding, pressing or stamping. A particular application for the method of the present invention is in forming the general and proprietary information in the central portion of a phonograph or video tape record which may, for example, be stamped from the pattern.

8 Claims, No Drawings

CHEMICAL ETCHING OF RECORD PATTERNS AND THE LIKE

BACKGROUND OF THE INVENTION

1. Field of the Invention

This invention relates to a method for producing characters and the like on the surface of an article, and more particularly to forming such characters in relief by chemical etching.

2. Description of the Prior Art

Chemical etching is a process known in the art as being useful in certain applications. Chemical etching has been utilized in the past to produce parts such as metal gaskets from very thin stock material. In this application, the etching process is used to totally remove the unwanted material. In other circumstances, chemical etching has been used to score material to make desired images therein, but the practice in the past has been to utilize the chemical etching only on the final article, and not on the mold or other pattern used to produce the article. Name plates, for example, have been chemically etched. The usual practice has been, however, to use a pantograph which manually gouges out the desired material. The known advantages of chemical etching include reducing tooling costs, production of a burr-free part which has not been stressed by the processing, wide application of the process to all metals and high tolerance levels.

Records, such as for phonographs or video tapes, have for a considerable time used the central portion of the usually circular disc to display proprietary and other information. The custom has been to print this information on a label which is applied to the record. This procedure contributes to the cost of records since the label entails printing, material and handling costs, and the application of the label must be performed in a separate production step. Another significant factor is the need to properly correlate the labels with the records upon which they are to be placed. The present invention has a particular application of providing this information on records by chemically etching the pattern from which the record is produced. Other procedures for physically working the pattern so that it will form the information on the produced record have not been found to be acceptable by the trade. The present invention, however, may be quickly, easily and inexpensively performed with excellent results being obtained.

SUMMARY OF THE INVENTION

A method is disclosed herein for forming characters in relief upon the surface of an article which comprises the steps of chemically etching the surface of a pattern to have characters in relief, and producing the final article by use of the pattern. The chemical etching process comprises the substeps of coating the pattern with a photo-sensitive resist, placing upon the resist a sheet having an image of the characters against a background, the characters in the background being distinguishable by one being opaque and the other being transparent, exposing the resist to a suitable light source to harden the portion of the resist exposed to the light through the transparent portion of the sheet, developing the resist, removing the soft portion of the resist from the pattern, etching the pattern to remove a portion of the pattern material from the surface from which the soft portion of the resist has been removed, and thereafter removing the hardened resist from the pattern. The present invention has a particular application in producing a pattern which will, simultaneous to formation of a record, form upon the record the proprietary and other information generally found in the central portion of the record.

It is an object of the present invention to provide a method for producing an article having characters and the like formed in relief upon the surface of the article.

Another object of the present invention is to provide a method for quickly, inexpensively and accurately altering the surface of a pattern so that characters and the like will be formed in relief upon the surface of an article formed therefrom.

A further object of the present invention is to provide an improved method for producing the proprietary and other information upon the central portion of a record.

Other objects and advantages of the present invention will become apparent from the description which follows.

DESCRIPTION OF THE PREFERRED EMBODIMENT

For the purposes of promoting an understanding of the principles of the invention, reference will now be made to the embodiment described herein. It will nevertheless be understood that no limitation of the scope of the invention is thereby intended, such alterations and further modifications in the method, and such further applications of the principles of the invention being contemplated as would normally occur to one skilled in the art to which the invention relates.

The method of the present invention provides excellent means for producing characters, figures, designs and the like in relief upon the surface of an article produced from a pattern. For the purposes of the specification and the claims, the term character is used to encompass figures, designs, logos and other information or designs desired to appear in relief on the surface of an article. The present invention may have wide and varied application, although a particular use of the described method is in producing the proprietary and other information in the central portion of a record. The method of the present invention will therefore be described in the particular application of labeling records, although no direct limitation to this field of use is intended thereby.

The method of the present invention may be used, for example, to apply such information as titles, side numbers, part numbers, logos, proprietary information and similar matter to the central portion of a record. A master pattern or plate from which the record will be produced is chemically etched in accordance with the present invention. The master typically used in the record industry is a nickel-silver alloy. However, the present invention would be equally applicable to a pattern formed from any metal or other material which may be chemically etched with suitable results.

The master should be cleaned, preferably with an organic solvent if the master is metal. The pattern is then coated with a photo-sensitive resist. The resist may be applied either as a dip coating, float coating as by pouring it on, or by otherwise manually applying the resist to the surface of the pattern. Resist systems are known in the art, and generally are indicated for use with particular metals or other materials which are to be etched. A resist system which has been successfully used in conjunction with a master record pattern is marketed under the trade name of PF Resist and is available from Hunt. Other resist systems include that marketed under the trademark Riston and available through DuPont. The Riston system is a dry resist which is heat laminated onto the pattern.

Portions of the pattern which are not intended to be etched may be treated in various ways. This consideration would arise, for example, if a record pattern being etched according to the present invention already includes the portion which will produce the sound track of the record. An undercoating of any suitable material such as a plastic or other film which will not react with the resist may be applied to the sound track portion of the record pattern. The resist may then be applied fully to the pattern, including application over the portion of the pattern covered by the undercoating material. Alternatively, the resist may be selectively located only on that portion which will be subjected to chemical etching. The remaining portion of the pattern may either be protected by other material which is applied at any time prior to the actual chemical etching, or, which is more difficult, the chemical etching process may be limited in scope to only that portion where the resist has been applied. It has been found that the undercoating generally is not required if the resist is located over the entire surface of the pattern, even in the circumstance in which the sound track portion of the record is already included in a record pattern. It has been found that the resist may be developed and hardened as will be described below, and that it may be subsequently removed without damaging or otherwise interfering with the sound track portion of the record pattern.

The resist is then preferably prebaked by heating it to a temperature of from about 100° F. to about 300° F., for a period of from about 5 minutes to about 20 minutes. In performing the method of the present invention with a record pattern as described, it has been found to be most preferable to maintain the resist at about 200° F. for about 10 minutes, or until dry to the touch. This prebaking partially drys the resist and facilitates subsequent handling of the pattern, particularly in assuring that the resist will remain evenly distributed on the pattern until developed. After the heating step has been completed, the resist and pattern should be allowed to cool to room temperature before proceeding. A representation of the characters desired to appear on the article produced from the pattern must then be located upon the resist. This is preferably accomplished by placing a sheet of material which has an image of these characters appearing against a suitable background. For the subsequent developing and etching to operate properly, either the characters or the background should be opaque with the other being transparent. The choice of which is opaque and which is transparent will depend upon the desired final appearance of the characters on the record or other article. The choice of whether the characters or the background should be opaque as they appear on the sheet will depend upon the further processing intended for the pattern. If the pattern will be directly used to mold or stamp or otherwise form the final article, then having the characters transparent and the background opaque will result in the characters appearing upraised on the surface of the pattern, and therefore indented on the surface of the final article. Conversely, the same result in the final article would be obtained by having the characters appear opaque on the sheet, if the pattern being chemically etched is intended to be used to form the mold, for example, which will subsequently be used to produce the final article. In any event, it should be clear that the selection of the characters or the background as being opaque and the intended final form of the produced article are merely a matter of choice, which will vary with circumstances and which does not affect the scope of the present invention.

It has been found that the sheet which is applied over the resist is favorably produced by photographic techniques. The art work is produced to size in accordance with known photographic procedures, and the positive or negative of the film may be layed directly onto the pattern. The sheet is preferably a polyester film marketed by E. I. du Pont de Nemours & Company, Inc. under the trade name Mylar. Likewise, any type of photographic film may be used. This material has been used in conjunction with the chemical etching of record patterns and has been found to produce excellent results. It is also preferable to join the sheet and the resist closely together by applying a vacuum therebetween. This procedure is utilized in other photographic techniques, and devices specifically intended for this purpose are available. One such device is the Colight Scanex which has been utilized in performing the method of the present invention.

The resist is then exposed to a suitable light source which causes the portion of the resist underlying the transparent portion of the sheet to harden, while the portion of resist under the opaque part of the sheet remains in a soft state. The resists available are adapted for exposure to particular light sources, such as mercury vapor lamp, arc lamp or other ultra-violet emission sources. Available vacuum-applying devices, such as the Colight Scanex, may include a light source which is operable to scan across an object held under vacuum. It is preferable that the exposure to the light source be performed while a vacuum is maintained between the resist and the sheet placed thereon. A particular performance of the method of the present invention was conducted using the Colight Scanex in which a mercury vapor light scanner is included and was employed to expose the resist.

The pattern with the resist is then developed in a suitable solution, which is generally available as a companion to the resist. The sheet is first removed, and the developing solution is applied to the resist, such as by spraying the solution onto the surface of the resist. After the resist has been developed, the soft portion of the resist will continue to be in a soft state, and is removed from the pattern, as by a water rinse. The hardened portion of the resist will remain substantially hard upon development and will thereby be resistant to the acids and related chemicals utilized in the actual etching of the pattern. The pattern is then preferably dried with forced air, and the resist is then baked until thoroughly dry. The baking is done to ensure hardness of the developed resist which may have softened somewhat due to application of the developing solution. The baking is preferably performed by maintaining the pattern and resist at a temperature of from about 100° F. to about 300° F., for a period of from about 5 minutes to about 20 minutes. In a particular application of the method of the present invention utilizing the record pattern as described, the resist was heated to 200° F. for about 10 minutes, and excellent results were achieved. The pattern and resist should then be allowed to cool to ambient temperature and the hardened resist inspected visually for any defects.

The pattern is then ready to be chemically etched in accordance with known techniques. Etching machines are available which permit the etching chemical to be applied to the exposed portions of the pattern under controlled conditions. The Chemcut 315 Etcher, marketed by the Chemcut Corporation of State College, Pa., has been found to produce excellent results in the method of the present invention. The Chemcut 315 Etcher sprays an acid onto the pattern, the acid operating to remove a portion of the exposed metal of the pattern.

The hardened resist is then removed from the pattern. This is preferably accomplished by use of a suitable chemical solvent matched to the particular resist, as is known in the art. The PF Resist which has been used in one application of the present method has a companion stripper known as Micro-Strip, also marketed by Hunt, which has been found to suitably strip the resist from a record pattern. The pattern is then rinsed and dried and is suitable for use in producing the desired article, such as a record, either directly or indirectly. As previously described, the chemically etched pattern may be used itself to produce the article, or it may be used to produce a mold or similar structure for producing the desired article.

A record pattern made in accordance with the present invention and used to form records produces a record which contains both the recording track grooves and the information such as side and part number, the desired logo, and related matter. This eliminates the time and expense associated with printing and applying paper labels to the pressed records. It has been found to be preferable in applying this method to record patterns to etch the pattern to up to about 0.010–0.015 inches. Excellent resolution and tolerances have been obtained in these circumstances and the lettering and other material is easily recognizable on the final record. It is also desirable in etching record patterns to etch a guide portion, preferably circular, located outside the diameter of the final record, so that the information being etched in the center may be suitably centered.

While there have been described above the principles of this invention in connection with specific apparatus, it is to be clearly understood that this description is made only by way of example and not as a limitation in the scope of the invention.

What is claimed is:

1. A method for forming characters in relief upon the central portion of a record which comprises the steps of:
   a. forming a pattern for the record;
   b. coating the pattern with a photo-sensitive resist;
   c. placing upon the resist a sheet having an image of the characters and of a guide portion against a background, the characters and the background being distinguishable by one being opaque and the other being transparent;
   d. exposing the resist to a suitable light source to harden the portion of resist exposed to the light through the transparent portion of the sheet;
   e. developing the resist;
   f. removing the soft portion of the resist from the pattern;
   g. etching the pattern to remove a portion of the pattern material from the surface from which the soft portion of the resist has been removed;
   h. after substep g., removing the hardened resist from the pattern; and
   i. forming the record from the pattern utilizing the guide portion for centering the etched characters.

2. The method of claim 1 in which substep b. comprises laying the sheet upon the resist and applying a vacuum between the sheet and the resist to join them closely together.

3. The method of claim 1 in which substep a. comprises contacting the pattern with a liquid photo-sensitive resist and then heating the resist until the surface of the resist is dry.

4. The method of claim 3 in which the resist is maintained at a temperature of from about 100° F. to about 300° F. for a period of from about 5 to about 20 minutes.

5. The method of claim 1 in which step i. comprises forming a videotape record.

6. The method of claim 1 in which step a. includes forming in the pattern a portion for producing the sound track of the record, and in which, prior to substep g., is included the step of applying a protective layer of material to the sound track portion of the pattern to prevent damage of the sound track portion during etching.

7. The method of claim 1 in which the image of the guide portion is circular and is located outside the diameter of the record.

8. The method of claim 6 in which the image of the guide portion is circular and is located outside the portion of the pattern for producing the sound track of the record.

* * * * *